US006538325B2

(12) United States Patent
Lautzenhiser (10) Patent No.: US 6,538,325 B2
(45) Date of Patent: Mar. 25, 2003

(54) MULTI-LAYER CONDUCTOR SYSTEM WITH INTERMEDIATE BUFFER LAYER FOR IMPROVED ADHESION TO DIELECTRICS

(75) Inventor: Frans Peter Lautzenhiser, Noblesville, IN (US)

(73) Assignee: Delphi Technologies, Inc., Troy, IN (US)

( * ) Notice: Subject to any disclaimer, the term of this patent is extended or adjusted under 35 U.S.C. 154(b) by 0 days.

(21) Appl. No.: 09/799,326

(22) Filed: Mar. 6, 2001

(65) Prior Publication Data

US 2002/0125574 A1 Sep. 12, 2002

(51) Int. Cl.⁷ .............................................. H01L 23/52
(52) U.S. Cl. .................. 257/758; 257/486; 257/759; 257/762; 257/765
(58) Field of Search ................... 257/486, 758–760, 257/762, 765, 768, 769; 438/118, 622, FOR 339, 688, 648, 650, 651, 687, 624; 428/209, 210, 615, 669

(56) References Cited

U.S. PATENT DOCUMENTS

| | | | | |
|---|---|---|---|---|
| 4,939,022 A | | 7/1990 | Palanisamy | 428/209 |
| 5,230,924 A | * | 7/1993 | Li | 427/229 |
| 5,360,991 A | * | 11/1994 | Abys et al. | 257/762 |
| 5,395,679 A | * | 3/1995 | Myers et al. | 428/209 |
| 5,527,627 A | | 6/1996 | Lautzenhiser et al. | 428/615 |
| 5,635,763 A | * | 6/1997 | Inoue et al. | 257/763 |
| 6,150,711 A | * | 11/2000 | Kom et al. | 257/766 |
| 6,168,873 B1 | * | 1/2001 | Ikeda et al. | 257/762 |
| 6,255,731 B1 | * | 7/2001 | Ohmi et al. | 257/758 |
| 6,320,265 B1 | * | 11/2001 | Chadrabarti et al. | 257/768 |
| 2001/0044015 A1 | * | 11/2001 | Niwa | 428/210 |

* cited by examiner

Primary Examiner—Steven Loke
Assistant Examiner—Quang Vu
(74) Attorney, Agent, or Firm—Jimmy L. Funke (57) ABSTRACT

A multi-layer conductor system including: a base layer having an electrically insulative top portion including alumina; an electrically conductive intermediate layer formed on the top portion of the base layer; and an electrically conductive top layer formed on the intermediate layer; wherein the intermediate layer includes alumina and a precious metal alloy consisting of silver and a precious metal other than silver; wherein the top layer comprises a precious metal selected from the group consisting of silver and a silver alloy such that the difference between the percentage weight of silver in the precious metal of the top layer and the percentage weight of silver in the precious metal alloy of the intermediate layer is limited to thereby provide advantages in use.

20 Claims, 4 Drawing Sheets

MULTI-LAYER CONDUCTOR SYSTEM WITH INTERMEDIATE BUFFER LAYER FOR IMPROVED ADHESION TO DIELECTRICS

TECHNICAL FIELD

The present invention relates to thick-film circuit systems incorporating surface-mount technology (SMT).

BACKGROUND OF THE INVENTION

Thick-film circuit systems are incorporated in many modern electronic systems. Typically, a thick-film circuit system includes a pre-fabricated substrate, one or more substantially horizontal layers of insulative dielectric material formed thereon, and one or more substantially horizontal layers of electrical conductors formed and interspersed between the layers of dielectrics. The layers of conductors are selectively electrically interconnected by way of metal vias which are formed and vertically routed through the dielectric layers which separate the conductor layers. The conductor layers thereby serve as electrical connections between various electrical components which may be formed and/or mounted over the pre-fabricated substrate. Such various electrical components may include, for example, pre-fabricated semiconductor integrated circuits (ICs), capacitors, inductors, and the like. In such a thick-film circuit system, the thick films which comprise the conductor layers may have, for example, thicknesses of anywhere from about 5 micrometers to about 30 micrometers. In addition, such a thick-film circuit system may even include, for example, ultra-thick thick films (UTTF) having thicknesses of up to about 130 micrometers.

Dielectric and conductor layers are typically formed over the substrate with a conventional screen printing technique. In such a technique, each individual layer is composed of its defining material elements and formed over the substrate by selectively screen printing the layer in a paste form over the substrate. Thereafter, the layer is then either merely dried or both dried and fired. During a typical drying step, the paste which is to form the new layer is exposed to an elevated temperature, for example, of 120° C. During a typical firing step, the layer is exposed to very high temperatures of, for example, up to 850° C. After firing, the new layer is cooled down to ambient or room temperature. Fabricating each layer with high temperatures in this way facilitates adhesion of the newly formed layer to the immediately underlying layer. It is apparent that since high-temperature fabrication occurs for each subsequent layer which is formed over the substrate, lower layers which have already been formed experience more high-temperature fabrication steps. Layers which experience excessive high-temperature steps may be susceptible to delamination or micro-cracking between layers. Thus, it is generally preferable to have as few layers on a substrate as possible to thereby reduce the number of required high-temperature steps.

Today, many thick-film circuit systems incorporate surface-mount technology (SMT), wherein pre-fabricated electrical components are soldered and thereby mounted to one or more conductors formed over the substrate. The firing of each of the conductor layers, however, often produces physical stress where the conductor layers and dielectric layers interface. Such stress at the interface of conductor layers and dielectric layers often causes undesirable delamination between the layers or produces undesirable micro-cracks in the layers at the interface which threaten to compromise the overall functional integrity of the thick-film circuit system. Furthermore, with regard to surface-mount technology, such delamination and micro-cracking is often exacerbated when a pre-fabricated electrical component is soldered to a conductor layer formed over a dielectric layer.

To avoid such delamination and micro-cracking problems, larger pre-fabricated components are typically soldered and mounted upon a conductor layer which is directly formed over the pre-fabricated substrate. The reason for this is because the pre-fabricated substrate is much tougher than a printed dielectric layer and so direct adhesion of a conductor to an underlying pre-fabricated substrate is typically better than the direct adhesion of a conductor to an underlying printed dielectric layer. As a result, any other conductor and dielectric layers carried on the substrate must be pre-formed and circuitously routed such that the substrate space that will ultimately be taken up by the subsequently-soldered electrical component will be unoccupied to accommodate the component. As a result, to properly accommodate the component, the density of printed conductors about each soldered component is necessarily increased and/or additional dielectric and conductor layers must be added to the substrate. Thus, the routing and printing schemes for conductor and dielectric layers around the component space must necessarily be more complex to conserve lateral substrate space. Also, since additional conductor and dielectric layers may be required to make up for the lost space to be occupied by the component, such additional layers dictate that additional high-temperature firing steps will be experienced by lower layers.

Thus, there is a present need in the art for improving the adhesion of printed conductors to underlying layers of printed dielectric over a substrate in a thick-film circuit system. If such adhesion were improved, alternating layers of conductors and dielectrics could then be formed over the substrate without having to provide lateral space for a pre-fabricated electrical component to be soldered and mounted to a conductor directly formed over the substrate. That is, the component could then instead be soldered to an upper or top conductor layer even though that same conductor layer is directly formed over a printed dielectric layer. In this way, the component need not necessarily be soldered only to a conductor formed immediately over an insulative substrate. As a result, lateral space upon the substrate would thereby be conserved by primarily routing conductor and dielectric layers underneath the component. Such would also reduce routing complexity and provide more flexibility as to the number of conductor and dielectric layers formed over the substrate.

SUMMARY OF THE INVENTION

The present invention provides a multi-layer conductor system with improved adhesion to printed thick-film dielectrics. According to the most basic embodiment of the invention, the multi-layer conductor system includes a base layer having an electrically insulative top portion comprising alumina, an electrically conductive intermediate layer formed on the top portion of the base layer, and an electrically conductive top layer formed on the intermediate layer. In this basic embodiment, the intermediate layer comprises alumina and a precious metal alloy having silver and a precious metal other than silver. Within the intermediate layer, the amount by weight of the precious metal alloy is greater than the amount by weight of the alumina, and the amount by weight of silver in the precious metal alloy is greater than the amount by weight of the other precious metal. The other precious metal within the intermediate layer is preferably selected from the group consisting of platinum and palladium. The metallic constituent of the top layer comprises silver. Preferably, the top layer is either essentially pure silver or a silver alloy. Such silver alloy is more particularly a precious metal alloy containing principally silver and lesser amounts of other precious metals. The term precious metal generally refers to gold, silver, platinum, and palladium.

Preferably, the difference between the percentage weight of silver in the precious metal of the top layer and the percentage weight of silver in the precious metal alloy of the intermediate layer is not more than approximately 5. In this way, each of the base layer, the intermediate layer, and the top layer are each characterized by a different amount of shrinkage with temperature such that the amount of shrinkage of the intermediate layer is between that of the top layer and the base layer. An advantage of this minimizing of difference in silver content is that it prevents silver diffusion, which can occur when there is a large difference in silver content between two layers and which results in a weak metal-depleted zone between the two layers.

According to preferred embodiments of the present invention, the intermediate layer has a percentage weight of alumina of up to approximately 10. Furthermore, in such embodiments, the difference between the percentage weight of silver in the precious metal of the top layer and the percentage weight of silver in the precious metal alloy of the intermediate layer is preferably not more than approximately 2.

Advantages, design considerations, and applications of the present invention will become apparent to those skilled in the art when the detailed description of the best mode contemplated for practicing the invention, as set forth hereinbelow, is read in conjunction with the accompanying drawings.

BRIEF DESCRIPTION OF THE DRAWINGS

The present invention will now be described, by way of example, with reference to the following drawings.

DESCRIPTION OF THE PREFERRED EMBODIMENTS

Figure 1:
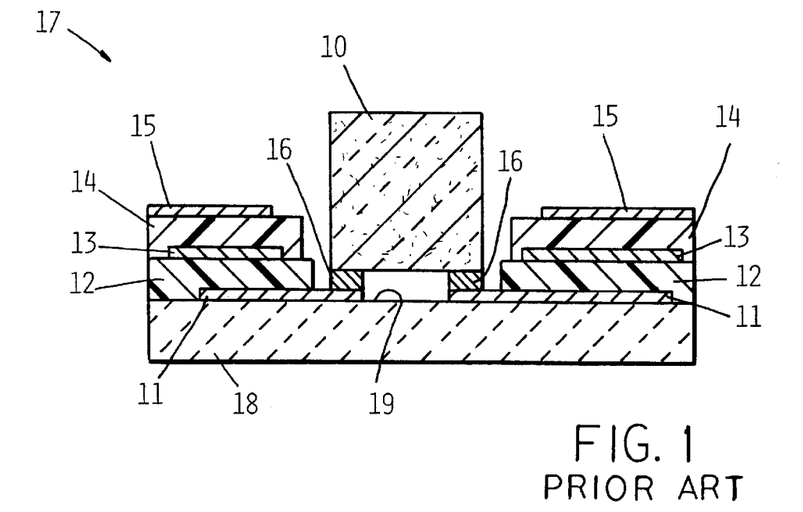
FIG. 1 illustrates a cross-sectional view of a prior art embodiment wherein a pre-fabricated electrical component is soldered to a conductor which is formed immediately over the substrate of a thick-film circuit system.

FIG. 1 illustrates a cross-sectional view of a prior art embodiment incorporating surface-mount technology (SMT) wherein a pre-fabricated electrical component 10 is mounted to electrically conductive first-layer conductors 11 which are formed immediately over a top surface 19 of a substrate 18 of a thick-film circuit system 17. The component 10 is mounted upon and in electrical communication with the first-layer conductors 11 via solder joints 16. The solder joints 16 primarily comprise tin/lead compositions. The substrate 18 primarily comprises, for example, an electrically insulative, pre-fabricated ceramic or alumina.

Formed immediately over the first-layer conductors 11 is an electrically insulative first-layer dielectric 12. Second-layer conductors 13, in turn, are formed immediately over the first-layer dielectric 12. Lastly, a second-layer dielectric layer 14 is formed immediately over the second-layer conductors 13, and third-layer conductors 15 are formed immediately over the second-layer dielectric 14. The conductor layers 11, 13, and 15 comprise, for example, a silver alloy such as a three-to-one (3:1) silver-palladium by weight. The dielectric layers comprise, for example, primarily alumina ($Al_2O_3$ or aluminum oxide). The conductor layers 11, 13, and 15 and the dielectric layers 12 and 14 are all formed by utilizing conventional screen printing techniques.

Figure 2:
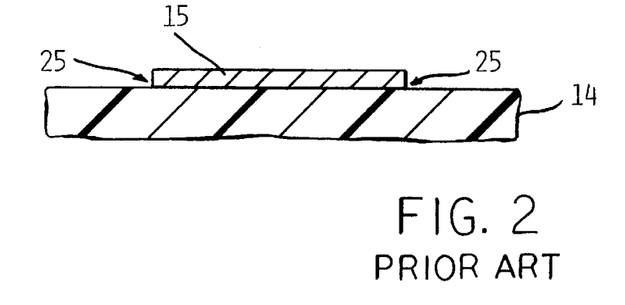
FIG. 2 illustrates a cross-sectional view of a prior art embodiment wherein a single-layer conductor is formed immediately over a printed dielectric layer.

FIG. 2 illustrates a close-up, cross-sectional view of the prior art embodiment illustrated in FIG. 1 wherein interface 25 between third-layer conductor 15 and printed second-layer dielectric 14 is particularly highlighted.

In the prior art embodiment of FIG. 1 incorporating surface-mount technology, it is important to note that the pre-fabricated electrical component 10 is solder mounted to first-level conductors 11 which are formed immediately over the substrate 18. In this way, the delamination problems commonly encountered when a component is solder mounted to a conductor which is formed immediately over a printed dielectric layer are avoided. This is because the direct adhesion of a conductor to an underlying prefabricated substrate is typically better than the direct adhesion of a conductor to an underlying printed dielectric layer.

As FIG. 1 illustrates, solder mounting a component to a conductor which is formed immediately over a substrate generally necessitates that the other conductor and dielectric layers must be circuitously routed upon the substrate to accommodate the component. As a result, to properly accommodate the component, the density in the number of printed conductors about each soldered component is necessarily increased and/or additional dielectric and conductor layers must be added. Thus, the routing and printing schemes for conductor and dielectric layers around the component space must necessarily be more complex to conserve lateral substrate space. Also, since additional conductor and dielectric layers may be required to make up for the lost space to be occupied by the component, such additional layers dictate that additional high-temperature firing steps will be experienced by lower layers. Such additional high-temperature fabrication steps sometimes precipitate undesirable delamination and micro-cracking between layers.

As a result of the present invention, it has been determined that certain differences in the nature of the respective material compositions of the conductor layers and the dielectric layers, differences in the thermal coefficients of expansion (TCE) of the conductor layers and the dielectric layers, and differences in the characteristic shrinkages respectively associated with the conductor layers and the dielectric layers during high-temperature fabrication steps lead to problems with cracking or deterioration.

By analysis according to the present invention, it has been determined that one property critical for the adhesion of a conductor on a printed dielectric is the degree to which both the conductor and the underlying dielectric change dimensions with temperatures. More particularly, the shrinkage when both are cooled after being exposed to a high temperature was investigated. The characteristic degrees of shrinkage for the conductor and the dielectric are related to their respective characteristic thermal coefficients of expansion (TCE). For example, a typical dielectric may have a TCE of anywhere from about 5 to 10 parts-per-million per degree Celsius (PPM/° C.), while a typical conductor may have a significantly higher TCE, anywhere from about 18 to 20 PPM/° C. Thus, for adjacent layers of different material compositions to exhibit favorable adhesion to one another, the difference between the characteristic TCEs of the two adjacent layers needs to be compatible. According to the present invention, to ensure favorable adhesion between two layers with significantly different TCEs, an intermediate "buffer" layer is formed between the two layers. The intermediate buffer layer is carefully composed of different materials such that its characteristic TCE is approximately between that of the other two layers. In this way, the indirect adhesion of the two layers to each other via the intermediate layer is better than the direct adhesion of the two layers to one another. It is this general concept upon which the present invention is, in large part, based.

Figure 3:
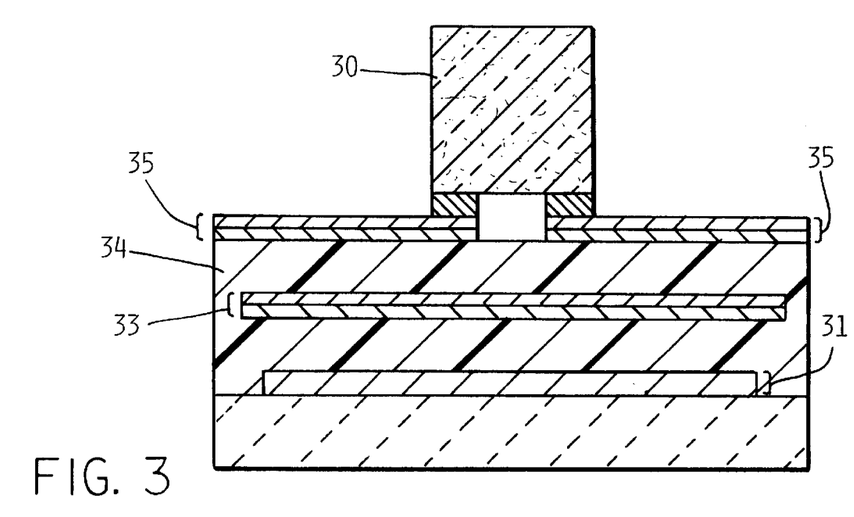
FIG. 3 illustrates a cross-sectional view of an embodiment according to the present invention wherein a pre-fabricated electrical component is soldered to a top-layer conductor which is formed immediately over a printed dielectric layer.
Figure 4:
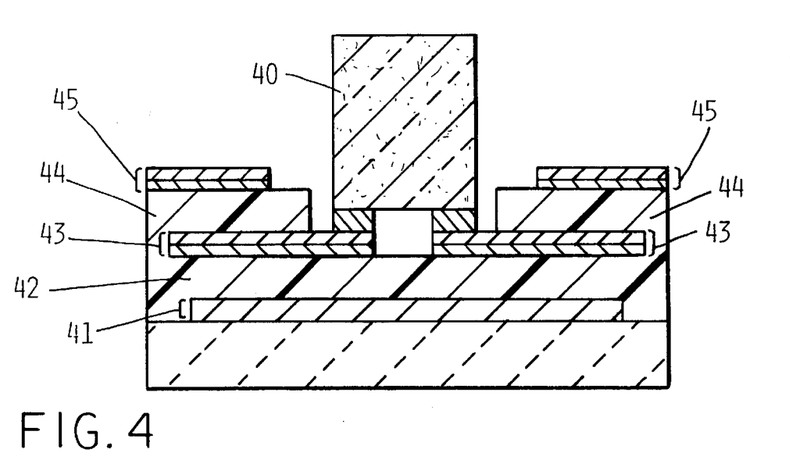
FIG. 4 illustrates a cross-sectional view of an embodiment according to the present invention wherein a pre-fabricated electrical component is soldered to a middle-layer conductor which is formed immediately over a printed dielectric layer.
Figure 5:
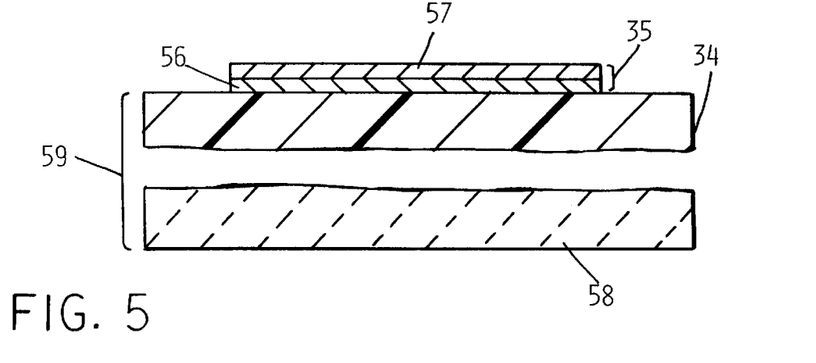
FIG. 5 illustrates a cross-sectional view of a general embodiment according to the present invention wherein a multi-layer conductor is formed immediately over a printed dielectric layer.

FIG. 3 illustrates a cross-sectional view of an embodiment according to the present invention incorporating surface-mount technology (SMT) wherein the pre-fabricated electrical component 30 is solder mounted to electrically conductive third-layer conductors 35 which are formed immediately over printed second-layer dielectric 34. FIG. 4, on the other hand, illustrates a cross-sectional view of an embodiment according to the present invention incorporating surface-mount technology (SMT) wherein the pre-fabricated electrical component 40 is solder mounted to electrically conductive second-layer conductors 43 which are formed immediately over printed first-layer dielectric 42. In addition, FIG. 5 illustrates a close-up, cross-sectional view of a general embodiment according to the present invention wherein the third-layer, multi-layer conductor 35 formed immediately over printed second-layer dielectric layer 34 in FIG. 3 is particularly highlighted. As in the case of the conductor layers 11, 13, and 15 in FIG. 1, the conductor layers 31, 33, 35, 41, 43, 45 in FIGS. 3, 4, and 5 are all formed by utilizing conventional screen printing techniques. Only the conductors 33, 35, 43, and 45 in FIGS. 3, 4, and 5, however, are formed according to the present invention and are all multi-layer conductors as opposed to the single-layer conductors 11, 13, and 15 illustrated as prior art in FIGS. 1 and 2.

In general, the present invention provides a multi-layer conductor system having a multi-layer conductor, such as 35 and 43 in FIGS. 3 and 4, with improved adhesion to a printed dielectric layer formed immediately underneath. According to the most basic embodiment of the invention as illustrated in FIG. 5, the multi-layer conductor system includes a base layer 59 having an electrically insulative top portion 34 (such as a printed dielectric layer) comprising alumina, an electrically conductive intermediate layer 56 formed on the top portion 34 of the base layer 59, and an electrically conductive top layer 57 formed on the intermediate layer 56. The very bottom portion 58 of the base layer 59 comprises a substrate material such as, for example, ceramic or metal alumina, or stainless steel. The multi-layer conductor 35, in accordance with the multi-layer conductor system, includes both the top layer 57 and the intermediate layer 56. In this basic embodiment, the intermediate layer 56 includes alumina and a precious metal alloy consisting of silver and a precious metal other than silver. Within the intermediate layer 56, the amount by weight of the precious metal alloy is greater than the amount by weight of the alumina, and the amount by weight of silver in the precious metal alloy is greater than the amount by weight of the other precious metal. This other precious metal within the intermediate layer 56 is selected from a group consisting of platinum and palladium.

Further according to the most basic embodiment of the invention, the top layer 57 comprises a precious metal selected from the group consisting of silver and a silver alloy such that the difference between the percentage weight of silver in the precious metal of the top layer 57 and the percentage weight of silver in the precious metal alloy of the intermediate layer 56 is not more than approximately 5. In this way, each of the base layer 59, the intermediate layer 56, and the top layer 57 is characterized by a different characteristic amount of shrinkage with temperature such that the characteristic amount of shrinkage of the intermediate layer is between the characteristic amount of shrinkage of the top layer 57 and the characteristic amount of shrinkage of the top portion 34 of the base layer 59.

According to advanced embodiments of the present invention, the intermediate layer 56 preferably has a percentage weight of alumina of up to approximately 10. Accordingly, such layer contains at least 90 parts by weight of the precious metal alloy and up to 10 parts by weight of the alumina. Minor amounts of other constituents such as, for example, bismuth oxide and/or cupric oxide may also be present. Preferred substrates include alumina, ceramic, or stainless steel. Furthermore, in such advanced embodiments, the difference between the percentage weight of silver in the precious metal of the top layer 57 and the percentage weight of silver in the precious metal alloy of the intermediate layer 56 is limited to not more than 10, desirably not more than 5, and is preferably not more than approximately 2.

It should be noted that the relatively close matching of the silver content of the top layer 57 and the intermediate layer 56 of the multi-layer conductor 35 helps ensure that silver diffusion, which can occur when there is a large difference in a silver content between two metal layers and which results in a weak metal-depleted zone between the two layers, will not occur and thereby effectively prevents delamination between the top layer 57 and the intermediate layer 56 of the multi-layer conductor 35. Furthermore, the alumina in the intermediate layer 56 of the conductor 35 and the alumina in the insulative top portion 34 of the base layer 59, as required by the present invention, helps ensure that differences in the thermal coefficient of expansion (TCE) and shrinkage mismatch between these two layers will be minimal and thereby effectively prevent delamination between the intermediate layer 56 and the top portion 34 of the base layer 59. The precious metal palladium or platinum included in the precious metal alloy in the intermediate layer 56 and/or in the precious metal of the top layer 57, as further required by the present invention, helps prevent leaching of silver whenever a solder joint is formed on the conductor 35. In this way, the precious metal palladium or platinum of the intermediate layer 56 and/or the top layer 57 of the conductor 35 ensures the integrity of any solder joint between the conductor 35 and any pre-fabricated electrical component solder mounted thereon. Since the alumina in the intermediate layer 56 generally makes the intermediate layer 56 itself unsolderable, the top layer 57 of the multi-layer conductor 35 is therefore necessary to provide a suitable conductor layer to which a pre-fabricated electrical component can be properly soldered.

Figure 6:
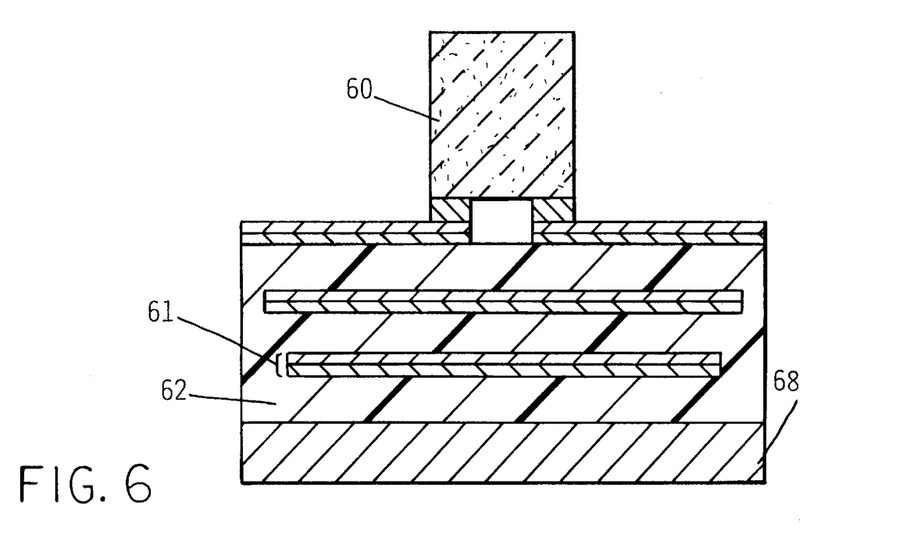
FIG. 6 illustrates a cross-sectional view of another general embodiment according to the present invention wherein a multi-layer conductor is formed immediately over a printed dielectric layer which is formed over a stainless steel substrate.

FIG. 6 illustrates a cross-sectional view of another general embodiment according to the present invention wherein a multi-layer conductor 61 is formed immediately over a printed dielectric layer 62 which is formed immediately over a stainless steel substrate 68. Since the stainless steel substrate 68 is, by its very nature, electrically conductive, the electrically insulative dielectric layer 62 is necessarily formed over the stainless steel substrate 68 before first-layer conductor 61 is formed. The particular embodiment illustrated in FIG. 6 further demonstrates the advantage of utilizing the multi-layer conductor system according to the present invention. In particular, since the multi-layer conductor system according to the present invention enables a conductor to be formed over a printed dielectric layer with sufficient adhesion therebetween, the present invention thereby permits the utilization of other substrate materials such as stainless steel.

Implementation of the multi-layer conductor system according to the present invention is hereinafter further explained by way of the following three examples.

EXAMPLE 1

Figure 7:
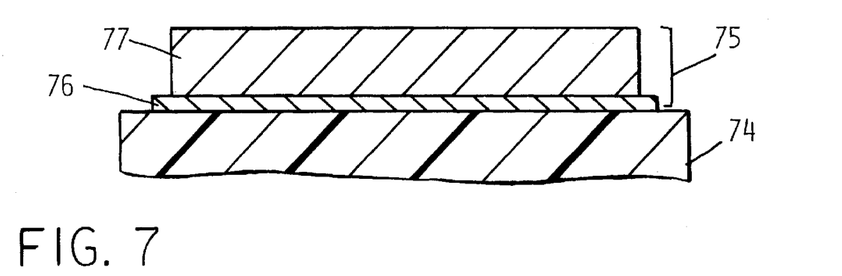
FIG. 7 illustrates a cross-sectional view of a first example according to the present invention wherein a multi-layer conductor, having a 3 mils (76.2 micrometers) thick top layer including silver and an intermediate layer including silver-palladium with alumina, is formed immediately over a printed dielectric layer including alumina.

In a first example as illustrated in FIG. 7, a multi-layer conductor 75 is formed immediately over a printed dielectric layer 74. The multi-layer conductor 75 comprises two printed layers, an intermediate layer 76 formed immediately over the dielectric layer 74, and a top layer 77 formed immediately over the intermediate layer 76. The top layer 77, in this first example, is an ultra-thick thick film (UTTF) having a fixed film thickness (FFT) of approximately three (3) mils (76.2 micrometers). Thus, as this first example illustrates, the present invention is fully compatible with ultra-thick thick film (UTTF) technologies. As a result, the present invention is compatible with and can incorporate the benefits associated with such UTTF technologies, wherein such benefits include high electrical current and better thermal management capabilities. See, for example, U.S. Pat. No. 5,527,627 issued to Lautzenhiser et al. on Jun. 18, 1996, which is fully incorporated herein by reference.

The dielectric layer 74, in its printed paste form before ultimately being dried and fired, primarily comprises alumina and includes oxides of one or more of the following: cobalt, boron, calcium, zirconium, and magnesium. The intermediate layer 76 primarily comprises a composition including approximately ninety-one percent (91%) silver-palladium (AgPd), approximately seven percent (7%) alumina ($Al_2O_3$), and approximately two percent (2%) of bismuth oxide and/or cupric oxide. The silver-palladium serves as a precious metal alloy of the intermediate layer 76 and has an approximate eighty-to-one (80:1) weight ratio. The top layer 77 primarily comprises a composition including approximately ninety-eight percent (98%) silver (Ag) and approximately two percent (2%) of bismuth oxide and/or cupric oxide.

Thus, in this first example, the top layer 77 includes silver as a precious metal. The intermediate layer 76 includes alumina and a precious metal alloy consisting essentially of silver and the precious metal palladium. The compatibility between the silver content of the top layer 77 and the intermediate layer 76 of the multi-layer conductor 75, as per the present invention, helps ensure that differences in the thermal coefficient of expansion (TCE) and shrinkage mismatch between these two layers will be minimal and thereby effectively prevent delamination between the top layer 77 and the intermediate layer 76 of the multi-layer conductor 75. Furthermore, the alumina in the intermediate layer 76 of the conductor 75 and the alumina in the printed dielectric layer 74 (that is, the insulative top portion of the base layer), according to the present invention, helps ensure that differences in the thermal coefficient of expansion (TCE) and shrinkage mismatch between these two layers will be minimal and thereby effectively prevent delamination between the intermediate layer 76 and the printed dielectric layer 74. The precious metal, in this example, palladium, included in the intermediate layer 76, as further required by the present invention, helps prevent leaching of silver whenever a solder joint is formed on the conductor 75. In this way, the precious metal palladium of the intermediate layer 76 of the conductor 75 ensures the integrity of any solder joint between the conductor 75 and any pre-fabricated electrical component solder mounted thereon.

Figure 8:
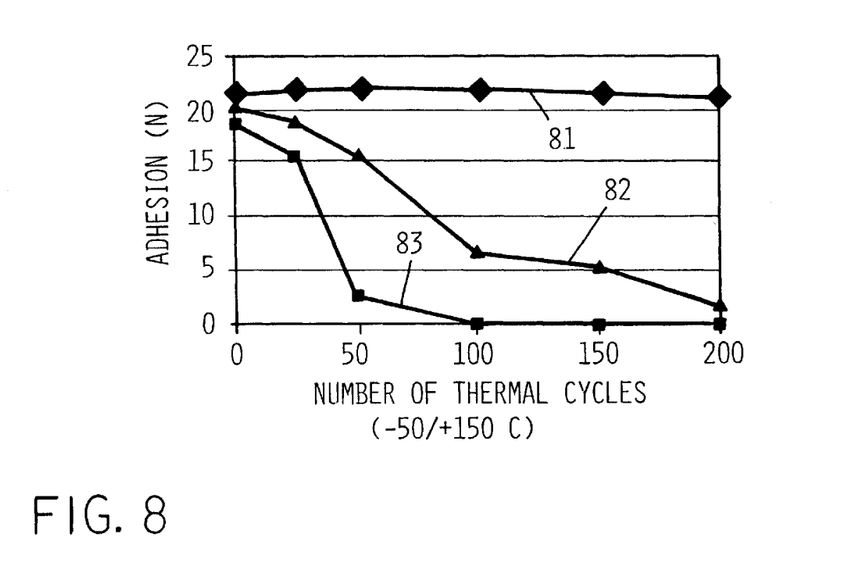
FIG. 8 illustrates a plotted graph demonstrating adhesion between layers of the first example when exposed to numerous thermal cycles.

FIG. 8 illustrates a plotted graph demonstrating adhesion between layers of the first example when exposed to numerous thermal cycles wherein each thermal cycle occurs between the temperatures of −50° C. and +150° C. More particularly, "thermal cycling" is a testing process wherein a structure or device is subjected to typically numerous thermal excursions over a wide temperature range to help determine the reliability of the structure or device. That is, the structure or device is typically repeatedly heated from a low temperature to a higher temperature and then cooled down to test reliability. For purposes of Example 1, the layers were heated to temperatures of +150° C. and cooled to −50° C. A single thermal cycle took approximately 90 minutes, with about 20-minute temperature plateaus at both of the extreme temperatures and with about 25-minute time periods to either heat or cool the layers between the two extreme temperatures. In FIG. 8, for comparison purposes, plotted line 81 represents the adhesion strength of the top layer in this first example when formed immediately over a ceramic or alumina substrate. Plotted line 82 represents the adhesion strength of the top layer 77 and intermediate layer 76 in this first example when formed immediately over the printed dielectric layer 74 in this first particular embodiment. Lastly, plotted line 83 represents the adhesion strength of a single-layer conductor, such as the top layer 77 of this first example without the intermediate layer 76, when formed immediately over a printed dielectric layer, such as printed dielectric layer 74. Thus, FIG. 8 demonstrates that the inclusion of the intermediate buffer layer 76 between the top layer 77 and the printed dielectric layer 74 results in better overall adhesion between the layers when compared to the adhesion of a single-layer conductor to a printed dielectric layer.

EXAMPLE 2

Figure 9:
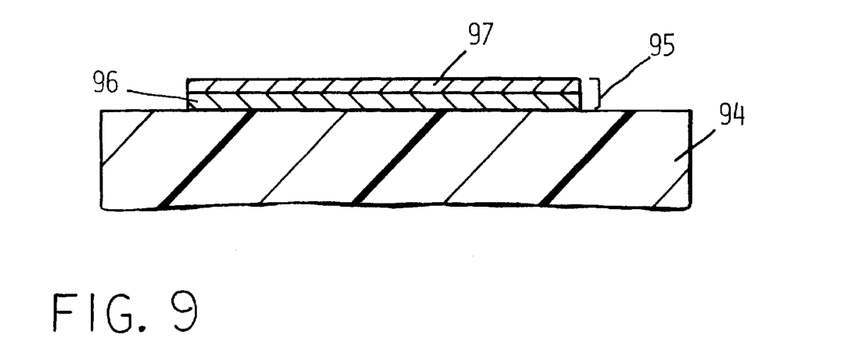
FIG. 9 illustrates a cross-sectional view of a second example according to the present invention wherein a multi-layer conductor, having a top layer including silver-platinum and an intermediate layer including silver-platinum with alumina, is formed immediately over a printed dielectric layer including alumina.

In a second example, as illustrated in FIG. 9, a multi-layer conductor 95 is formed immediately over a printed dielectric layer 94. The multi-layer conductor 95 comprises two printed layers, an intermediate layer 96 formed immediately over the dielectric layer 94, and a top layer 97 formed immediately over the intermediate layer 96.

The dielectric layer 94, in its printed paste form before ultimately being dried and fired, primarily comprises alumina as described with respect to Example 1. The intermediate layer 96 primarily comprises a commercially-available composition including silver-platinum (AgPt), with approximately two percent (2%) alumina ($Al_2O_3$) included in the overall intermediate layer 96. The silver-platinum serves as a precious metal alloy of the intermediate layer 96 and has an approximate ninety-nine-to-one (99:1) weight ratio of silver-to-platinum. The top layer 97 primarily comprises a commercially-available composition including silver-platinum. As in the intermediate layer 96, the silver-platinum composition in the top layer 97 has an approximate ninety-nine-to-one (99:1) weight ratio of silver-to-platinum.

Thus, in this second example, the top layer 97 includes the stated silver-platinum precious metal silver alloy. The intermediate layer 96 includes alumina and the stated silver-platinum precious metal alloy. Since the alloys are the same in the top layer 97 and the intermediate layer 96 of the multi-layer conductor 95, and since the intermediate layer 96 includes alumina, differences in the thermal coefficient of expansion (TCE) and shrinkage mismatch between the top layer 97 and the intermediate layer 96 and between the intermediate layer 96 and the dielectric layer 94 will be minimal and thereby effectively prevent delamination between all of the layers. The resultant benefit of minimized silver leaching upon formation of solder joints, due to the precious metal platinum, is as described with reference to Example 1 wherein the precious metal palladium is instead utilized.

Figure 10:
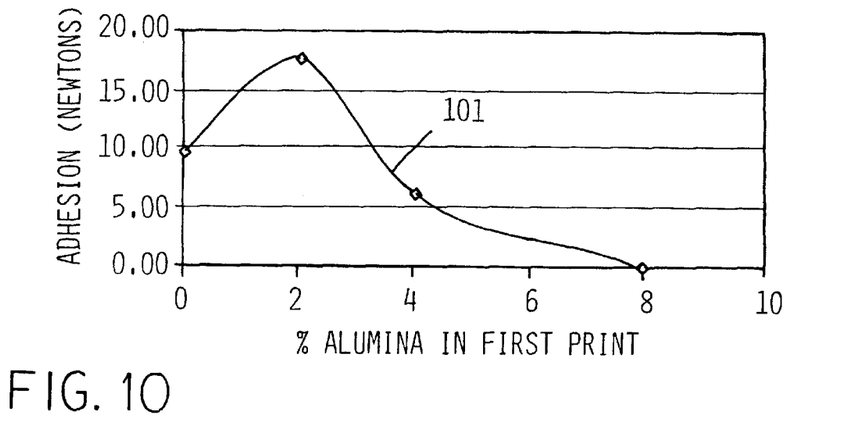
FIG. 10 illustrates a plotted graph demonstrating adhesion between layers of the second example based upon the alumina content in the intermediate layer.

FIG. 10 illustrates a plotted graph demonstrating adhesion between layers of the second example when exposed to two-hundred and fifty (250) thermal cycles wherein each thermal cycle occurs between the temperatures of −40° C. and +125° C. In particular, for purposes of Example 2, the layers were heated to temperatures of +125° C. and cooled to −40° C. A single thermal cycle took approximately 120 minutes, with about 30-minute temperature plateaus at both of the extreme temperatures and with about 30-minute time periods to either heat or cool the layers between the two extreme temperatures. In FIG. 10, plotted line 101 represents the adhesion strength of the multi-layer conductor 95 in this second example when formed immediately over a printed dielectric layer, such as printed dielectric layer 94.

As the plotted graph in FIG. 10 illustrates, the top layer 97 and the intermediate layer 96 together best adhere to the underlying dielectric layer 94 when the intermediate layer 96 contains approximately two percent (2%) alumina.

EXAMPLE 3

Figure 11:
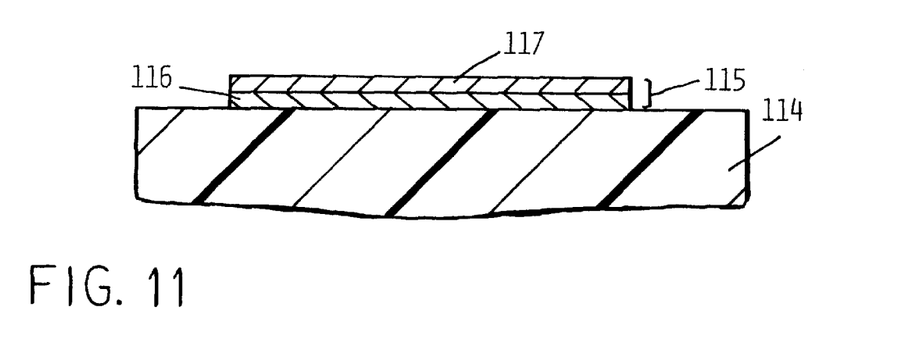
FIG. 11 illustrates a cross-sectional view of a third example according to the present invention wherein a multi-layer conductor, having a top layer including silver-platinum and an intermediate layer including silver-palladium with alumina, is formed immediately over a printed dielectric layer including alumina.

In a third example, as illustrated in FIG. 11, a multi-layer conductor 115 is formed immediately over a printed dielectric layer 114. The multi-layer conductor 115 comprises two printed layers, an intermediate layer 116 formed immediately over the dielectric layer 114, and a top layer 117 formed immediately over the intermediate layer 116.

The dielectric layer 114 is as described with respect to Example 1. The intermediate layer 116 primarily comprises a commercially-available composition including approximately ninety-one percent (91%) silver-palladium (AgPd), approximately seven percent (7%) alumina ($Al_2O_3$), and approximately two percent (2%) of bismuth oxide and/or cupric oxide. The silver-palladium serves as a precious metal alloy of the intermediate layer 116 and has an approximate eighty-to-one (80:1) weight ratio. The top layer 117 primarily comprises a commercially available composition including silver-platinum. This silver-platinum composition in the top layer 117 has an approximate ninety-nine-to-one (99:1) weight ratio.

Thus, in this third example, the top layer 117 includes the silver-platinum composition as a precious metal. The intermediate layer 116 includes alumina and a precious metal alloy consisting essentially of silver and the palladium. The compatibility between the silver content of the top layer 117 and the intermediate layer 116 of the multi-layer conductor 115, as per the present invention, minimizes differences in the thermal coefficient of expansion (TCE) and minimizes shrinkage mismatch between these two layers. This reduces or prevents delamination between the top layer 117 and the intermediate layer 116 of the multi-layer conductor 115. Furthermore, the alumina in the intermediate layer 116 of the conductor 115 and the alumina in the printed dielectric layer 114 (that is, the insulative top portion of the base layer), as per the present invention, also reduces differences in the thermal coefficient of expansion (TCE) and shrinkage mismatch between these two layers. This minimizes or prevents delamination between the intermediate layer 116 and the printed dielectric layer 114. As in Examples 1 and 2, the platinum in the top layer 117 and the precious metal palladium included in the intermediate layer 116 help prevent leaching of silver whenever a solder joint is formed on the conductor 115. In this way, both the platinum in the top layer 117 and the precious metal palladium of the intermediate layer 116 of the conductor 115 enhances the integrity of any solder joint between the conductor 115 and any prefabricated electrical component solder mounted thereon.

In general, platinum works better than palladium in helping to prevent silver leaching and thereby ensuring the integrity of a solder joint to a silver alloy conductor. Although prices fluctuate, platinum is typically historically more expensive than palladium. Thus, to partially retain the superior soldering benefits associated with utilizing platinum instead of palladium, and to partially retain the cost savings associated with utilizing palladium instead of platinum, this third example incorporates silver-platinum in the top layer 117 to ensure maximum soldering integrity on the top layer 117, and incorporates silver-palladium in the intermediate layer 116 to reduce the cost of utilizing silver-platinum in both the top layer 117 and the intermediate layer 116.

Figure 12:
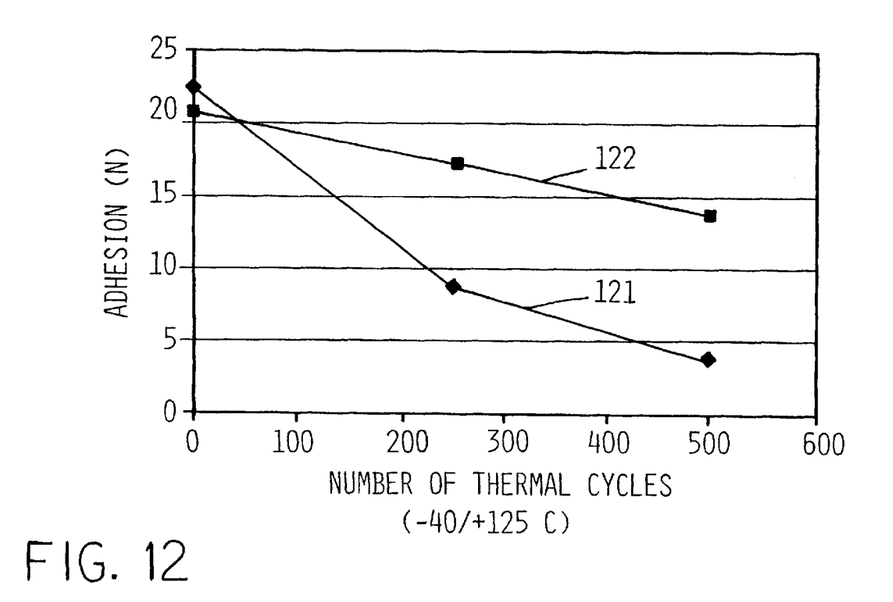
FIG. 12 illustrates a plotted graph demonstrating adhesion between layers of the third example when exposed to numerous thermal cycles.

FIG. 12 illustrates a plotted graph demonstrating adhesion between layers of the third example structure when exposed to numerous thermal cycles wherein each thermal cycle occurs between the temperatures of −40° C. and +125° C. In FIG. 12, for comparison purposes, plotted line 121 represents the adhesion strength of a standard, single-layer conductor, comprising silver-palladium having a three-to-one (3:1) weight ratio which has been commonly used in prior art applications, to a dielectric layer, such as dielectric layer 114. In contrast, plotted line 122 represents the adhesion strength of the multi-layer conductor 115 in this particular third example when formed immediately over a printed dielectric layer, such as dielectric layer 114. As the plot in FIG. 12 illustrates, the adhesion strength of the third example, multi-layer conductor to an underlying dielectric layer is significantly better than the adhesion strength of the prior art, single-layer conductor to an underlying dielectric layer. For purposes of the experiment leading to the plotted graph in FIG. 12, both the conductor of this third example and the prior art conductor were printed over the dielectric layer after the dielectric layer had first been dried. Thereafter, each conductor was respectively co-fired with the underlying dielectric layer.

As demonstrated by the plotted graph in FIG. 12, there are then at least three significant advantages to utilizing the multi-layer conductor 115 of this third example instead of the prior art, single-layer silver-palladium (3:1) conductor. The first advantage is cost savings. That is, given that palladium is a metal which costs more than silver, the increased silver content and reduced palladium content of the multi-layer conductor as compared to the prior art single-layer conductor results in the multi-layer conductor being less expensive than the single-layer conductor. A second advantage relates to electrical conductivity. Given that an increased palladium content reduces the conductivity of silver-rich alloys, the higher silver content in the multi-layer conductor as compared to the prior art single-layer conductor generally dictates that the multi-layer conductor is less electrically resistive than the single-layer conductor. The third advantage, as the plotted graph in FIG. 12 clearly illustrates, is that the multi-layer conductor has significantly better thermal-cycled adhesion to an underlying printed dielectric layer than does the single-layer conductor.

The inventive concept described herein concerning the minimizing of mis-match between layers of thermal expansion, or change of dimension with temperatures, is applicable to dielectric and substrate layers. Thus, one of the advantages of the present invention is that different substrate materials can be utilized, such as alumina, ceramic, or stainless steel. In the case of stainless steel, a dielectric layer must generally be printed before a conductor can be printed since the stainless steel is electrically conductive. In the case of alumina or ceramic, a conductor can generally be printed directly on the substrate since the substrate is not electrically conductive. In utilizing the present invention, the printed dielectric layer and the substrate layer are also selected to have compatible thermo-mechanical properties, whereby their thermal expansion or change of dimension with temperature does not lead to premature delamination.

While the present invention has been described in what are presently considered to be the most practical and preferred embodiments and/or implementations, it is to be understood that the invention is not to be limited to the disclosed embodiments, but on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A multi-layer conductor system comprising:
    a base layer having an electrically insulative top portion comprising alumina;
    an electrically conductive intermediate layer formed on said top portion of said base layer; and
    an electrically conductive top layer formed on said intermediate layer, said top layer comprising precious metal selected from the group consisting of silver and an alloy of silver;
    wherein said intermediate layer comprises alumina, and a precious metal alloy having silver and a metal selected from the group consisting of platinum, palladium and mixtures thereof; the amount by weight of said precious metal alloy being greater than the amount by weight of said alumina in said intermediate layer, and the amount by weight of silver in said precious metal alloy being greater than the amount by weight of said selected metal, and
    provided that the percentage weight of silver in said precious metal of said top layer and the percentage weight of silver in said precious metal alloy of said intermediate layer are selected to provide said intermediate layer having an amount of shrinkage with temperature that is between that of said top layer and said top portion of said base layer.

2. The multi-layer conductor system of claim 1 wherein the difference between the percentage weight of silver in said precious metal of said top layer and the percentage weight of silver in said precious metal alloy of said intermediate layer is not more than about 5; whereby said top portion of said base layer, said intermediate layer, and said top layer each have an amount of shrinkage with temperature such that the amount of shrinkage of said intermediate layer is between the amount of shrinkage of said top layer and the amount of shrinkage of said top portion of said base layer.

3. The multi-layer conductor system according to claim 1, wherein said intermediate layer has a percentage weight of alumina of up to about 10.

4. The multi-layer conductor system according to claim 1, wherein said intermediate layer has a percentage weight of alumina of up to about 7.

5. The multi-layer conductor system according to claim 1, wherein the difference between the percentage weight of silver in said precious metal of said top layer and the percentage weight of silver in said precious metal alloy of said intermediate layer is not more than approximately 2.

6. The multi-layer conductor system according to claim 1, wherein said base layer has an electrically insulative bottom portion comprising alumina.

7. The multi-layer conductor system according to claim 1, wherein said base layer has an electrically insulative bottom portion comprising ceramic.

8. The multi-layer conductor system according to claim 1, wherein said base layer has a bottom portion comprising stainless steel.

9. The multi-layer conductor system according to claim 1, wherein said precious metal of said top layer consists essentially of silver .

10. The multi-layer conductor system according to claim 1, wherein said top layer comprises 98 percent by weight silver.

11. The multi-layer conductor system according to claim 1, wherein said precious metal alloy of said intermediate layer consists essentially of silver-palladium alloy.

12. The multi-layer conductor system according to claim 11, wherein the weight ratio of silver to palladium is about 80 to 1 in said intermediate layer.

13. The multi-layer conductor system according to claim 1, wherein said intermediate layer comprises about 90 percent by weight of an alloy of silver-palladium.

14. The multi-layer conductor system according to claim 1, wherein said precious metal of said top layer consists essentially of silver-platinum alloy.

15. The multi-layer conductor system according to claim 14, wherein the weight ratio of the silver to platinum is about 99 to 1.

16. The multi-layer conductor system according to claim 1, wherein said precious metal alloy of said intermediate layer consists essentially of silver-platinum.

17. The multi-layer conductor system according to claim 16, wherein the weight ratio of the silver to platinum is about 99 to 1.

18. The multi-layer conductor system according to claim 1, wherein said intermediate layer has a percentage weight of alumina of about 2.

19. The multi-layer conductor system according to claim 1, wherein the extent of shrinkage of the intermediate layer is less than the extent of shrinkage of said top layer.

20. The multi-layer conductor system according to claim 1, wherein the extent of shrinkage of the intermediate layer is greater than the extent of shrinkage of said top portion of said base layer.

* * * * *